United States Patent [19]

Hänseler et al.

[11] Patent Number: 4,534,472
[45] Date of Patent: Aug. 13, 1985

[54] GUIDE RAIL FOR ELECTRONIC MODULE SUPPORTS

[75] Inventors: Urs Hänseler, Pfaffhausen; Urs Meier, Bassersdorf; Franz Muther, Zürich, all of Switzerland

[73] Assignee: Contraves AG, Zürich, Switzerland

[21] Appl. No.: 533,663

[22] Filed: Sep. 19, 1983

[30] Foreign Application Priority Data

Sep. 30, 1982 [CH] Switzerland ............... 5778/82

[51] Int. Cl.³ ............................................. H02B 1/02
[52] U.S. Cl. ........................................ 211/41; 361/415; 248/221.4; 248/223.3; 24/625; 24/453; 403/405.1
[58] Field of Search ............... 248/221.4, 223.3, 223.4, 248/224.1, 224.2, 224.4, 73, 503.1, 239, 235, 243, DIG. 11; 211/41; 361/413, 415, 391; 403/405; 24/625, 453, 297

[56] References Cited

U.S. PATENT DOCUMENTS

| 2,639,311 | 5/1953 | Cook ........................ 403/252 |
| 3,179,969 | 4/1965 | Glynn ........................ 24/625 |
| 3,253,084 | 5/1966 | Taylor ........................ 248/73 |
| 3,567,998 | 3/1971 | Ammerman ........................ 361/415 |
| 3,599,234 | 8/1971 | Andreini ........................ 361/415 |
| 3,736,472 | 5/1973 | Muldoon ........................ 361/415 |
| 3,829,741 | 8/1974 | Athey ........................ 361/415 |
| 3,895,719 | 7/1975 | Cakora ........................ 211/41 |
| 3,939,382 | 2/1976 | Lacau et al. . |
| 4,019,099 | 4/1977 | Calabro ........................ 211/41 |
| 4,168,067 | 9/1979 | Wiczer ........................ 248/221.4 |
| 4,356,601 | 11/1982 | Kimura ........................ 24/297 |
| 4,393,561 | 7/1983 | Yuda ........................ 24/625 |
| 4,407,416 | 10/1983 | Anderson ........................ 361/415 |

FOREIGN PATENT DOCUMENTS

| 1271793 | 7/1968 | Fed. Rep. of Germany . |
| 2554106 | 8/1977 | Fed. Rep. of Germany . |
| 1578065 | 8/1969 | France . |
| 2225916 | 11/1974 | France . |
| 1230138 | 4/1971 | United Kingdom . |

Primary Examiner—J. Franklin Foss
Assistant Examiner—Robert A. Olson
Attorney, Agent, or Firm—Werner W. Kleeman

[57] ABSTRACT

A guide rail for electronic module supports has at each of the front and rear ends of the guide rail body a latching element for latchable connection with a respective transverse support member, and resilient latching heads or snap-in connector tabs which engage with correspondingly formed apertures in metal strips disposed in the transverse support members. In order to halve the distance between the guide rails to one another as determined by the apertures, there are provided between the latching arms of the latching elements correspondingly shaped separating or divider elements which are selectively insertable in the apertures or on the cross-pieces disposed between the apertures. For the latchable fastening of a connector on the inner rear surface of a rack there is further provided at the rear end of the guide rail body a securing element furnished with a plug.

12 Claims, 8 Drawing Figures

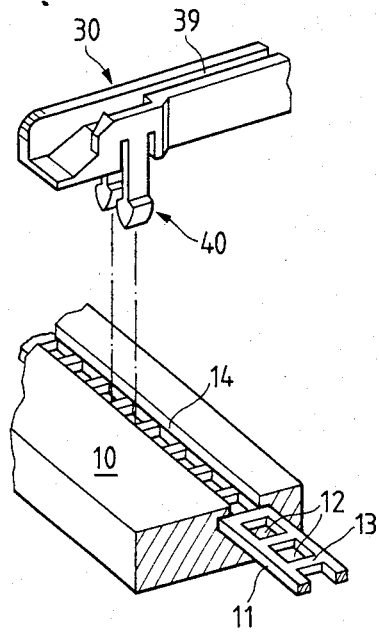
FIG. 5
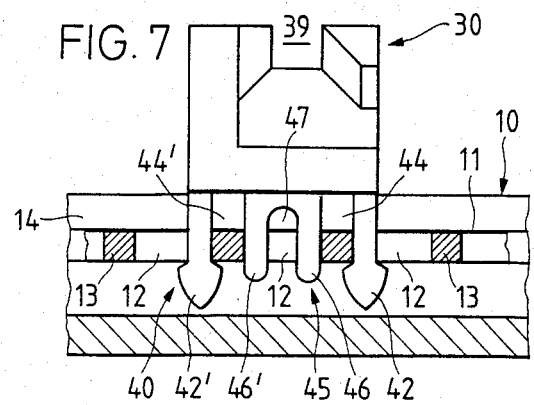
FIG. 7
FIG. 8
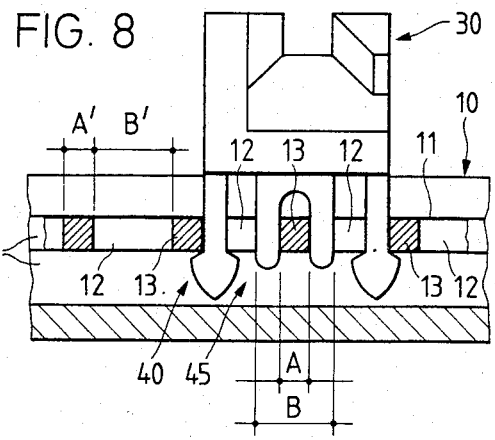
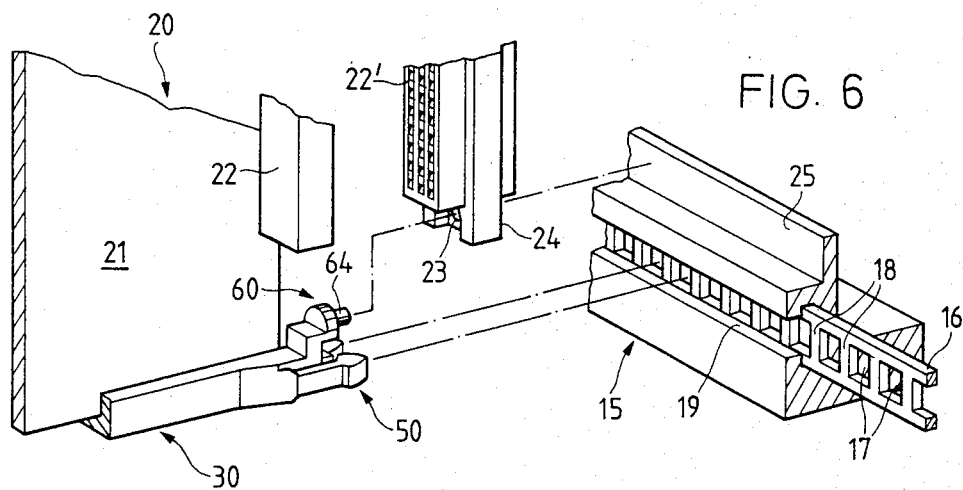
FIG. 6

GUIDE RAIL FOR ELECTRONIC MODULE SUPPORTS

CROSS-REFERENCE TO RELATED APPLICATION

This application is related to our commonly assigned, copending U.S. application Ser. No. 533,662, filed Sept. 19, 1983 and entitled "MODULAR ASSEMBLY OR THE LIKE", the disclosure of which is incorporated herein by reference.

BACKGROUND OF THE INVENTION

The present invention is concerned with a new and improved guide rail for electronic module supports for latchable fastening to the support members of a support rack or frame, in which at one end of the substantially U-shaped guide rail body a first latching element is provided, and at the other end a second latching element is provided, which engage by means of resiliently formed connecting arms in apertures arranged in the support members at suitable intervals and separated by cross-pieces.

From German Published Patent No. 2,554,106, published July 14, 1977, a guide rail is known which is provided at its front and rear ends with a fastening element for the latchable fastening to correspondingly arranged cross rails of a support frame. The fastening element engages resiliently in corresponding apertures provided in the cross rails. The single latching element provided on the rail body and angled downwardly comprises two resilient elements disposed at a distance to one another which are formed substantially parallel to the cross rail apertures. Between the resilient elements of the individual fastening elements there is provided a guide element for achieving the necessary tolerance compensation, formed of two resiliently constructed bars, which engages with additional apertures of the cross rails.

SUMMARY OF THE INVENTION

It is a primary object of the present invention to provide a new and improved construction of modular assembly or the like which is not afflicted with the shortcomings and drawbacks of prior art constructions of such type of guide rails.

It is another more specific object of the present invention to develop a guide rail of the kind described so that the predetermined distance determined by the apertures in the support pieces of the individual guide rails disposed in rows in the rack is substantially halved, and thus an optimal packing density of the module supports in the rack is achieved.

According to the invention these objects are achieved in that between the latching arms of the two latching elements or members a separating or divider element is provided, selectively insertable in the apertures or latchable onto the cross-pieces arranged between the apertures.

According to a further feature of the invention a securing or holder element having a plug for the latchable fastening of a connector to the inner back or rear surface of the support frame or rack is provided at the rear or back end of the guide rails.

BRIEF DESCRIPTION OF THE DRAWINGS

The invention will be better understood and objects other than those set forth above, will become apparent when consideration is given to the following detailed description thereof. Such description makes reference to the annexed drawings wherein:

FIG. 5 is a perspective sectional view with the front of the guide rail shown in disconnected condition, which can be latched into a first support member;

FIG. 6 is a perspective sectional view with a rear portion of the guide rail shown in disconnected condition, which can be latched into the second support member;

FIG. 7 is a sectional view, to a greater scale, of the support member or ledge with the guide rail inserted in a first position; and FIG. 8 illustrates the support member according to FIG. 7 with the guide rail inserted in a second position.

DETAILED DESCRIPTION OF THE PREFERRED EMBODIMENTS

Describing now the drawings it is to be understood that only enough of the construction of the guide rail for electronic module supports and the related structure has been shown as needed for those skilled in the art to readily understand the underlying principles and concepts of the present development, while simplifying the showing of the drawings.

Figure 1:
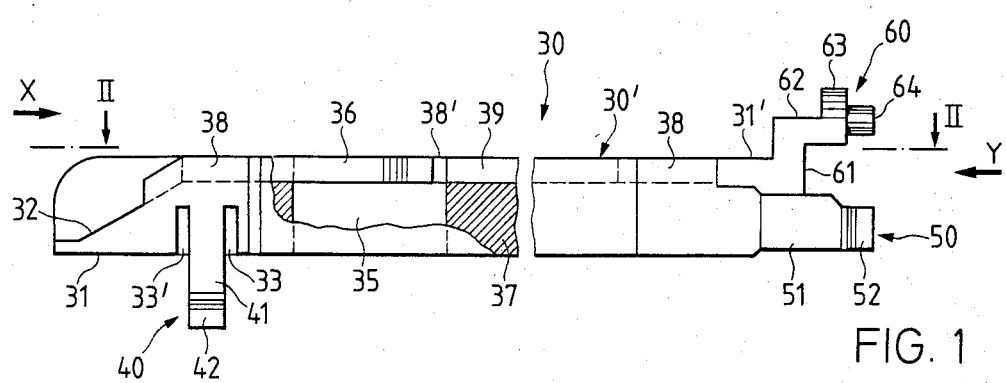
FIG. 1 shows in side elevation, partially in section, a guide rail for a module support which can be inserted into a rack or support frame.
Figure 2:
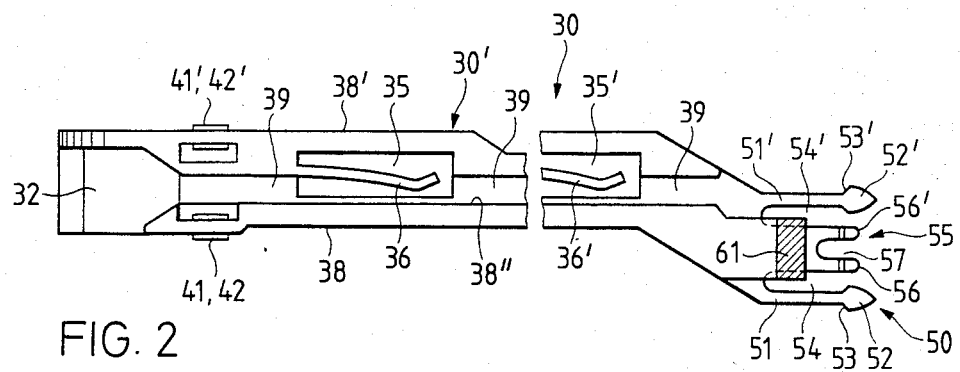
FIG. 2 is a top plan view, partially in section, taken substantially along the line II—II of the guide rail of FIG. 1.

In FIG. 1 the numeral 30 designates a guide rail shown in elevation and in FIG. 2 it is shown in plan and partially in section along the line II—II of FIG. 1. The guide rail 30 has a substantially U-shaped cross-section consisting of side walls 38, 38' and of a base 37.

In the front portion of the guide rail 30 there is provided at the lower side 31 a first latching element 40 oriented downwardly at substantially a right angle, and on the rear portion a second latching element 50 is formed, constituting a longitudinal extension of the guide rail body 30'. Furthermore there is provided at the rear portion of the guide rail body 30' a securing or holder element 60 extending upwardly at right angles.

The guide rail 30, which is provided with a longitudinal groove 39, is formed with several recesses 35, 35' arranged at intervals to one another, into which project, as shown in FIG. 2, resilient elements or tongues 36, 36' formed on the side wall 38'. A module support 20, not shown in FIGS. 1 to 4, is inserted in the longitudinal groove 39 and is pressed against the inner side 38" of the side wall 38 by means of the resilient elements 36, 36'.

Figure 3:
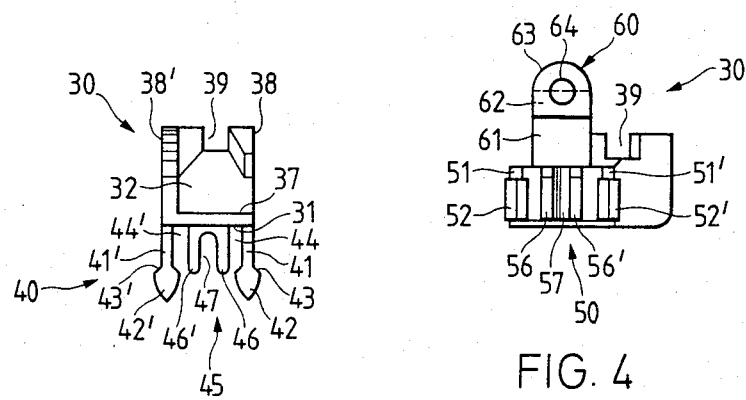
FIG. 3 is a front view seen in the direction of the arrow X of FIG. 1 with the front portion of the guide rail.

The first latching element 40 formed on the lower side 31 of the guide rail 30 comprises two latching arms 41, 41' extending downwardly and disposed at a distance apart from one another, and each carrying latching heads or snap-in connector tabs 42, 42'. The transition from the latching arms 41, 41' to the heads or tabs 42, 42' is constituted by an incline 43, 43' as shown in FIG. 3 in greater detail. These two latching members defined by the latching arms 41, 41' and which are formed as extensions of the side walls 38, 38' and are directed downwardly are separated from the side walls 38, 38' by means of slots 33, 33' and thereby are formed resiliently perpendicularly to the longitudinal axis of the guide rail 30.

In FIG. 3 the guide rail 30, which consists essentially of the side walls 38, 38' and the base 37, is shown in end view according to the arrow X of FIG. 1, and there can be seen, as more clearly shown in such FIG. 1, an introductory or insertion portion 32 formed as an incline, the groove 39 for the module support 20, as well as the first latching element 40 comprising the latching arms 41, 41' and the latching heads or snap-in connector tabs 42, 42' which are substantially drop-shaped in cross-section. Between the two latching arms 41, 41' of the latching element 40 a separating or divider element 45 is provided parallel to the latching arms, which has two prongs 46, 46' separated by a pocket or recess 47. Between the two prongs 46, 46' of the separating element 45 and the latching arms 41, 41' of the latching element 40 there is provided a respective gap 44, 44', whereby also the prongs 46, 46' are resiliently formed at right angles to the length of the guide rail 30.

The second latching element 50, formed at the rear portion and in continuation of the guide rail body 30' and essentially formed onto the side walls, includes the parts 51, 51' and 52, 52' with the inclines 53, 53' as well as a separating or divider element 55 with the parts 56, 56' which are separated from one another by the respective gaps 54, 54' and by means of the pocket or recess 57. The second latching element 50 is formed in substantially the same way as the first latching element 40, and the parts 51, 51' of the second latching element 50 as well as the parts 56, 56' of the separating element 55 are also formed resiliently at right angles to the length of the guide rail 30.

As further shown in FIG. 1, at the rear portion of the guide rail 30 on the upper side 31' the securing or holder element 60 is formed, which has a first and a second arm 61, 63 projecting upwardly, a bar or web 62 positioned parallel to the upper side 31' as well as a plug or boss 64 formed on the arm 63.

Figure 4:
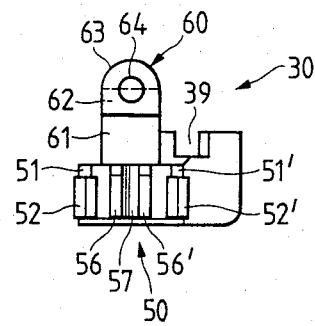
FIG. 4 is a rear view seen in the direction of the arrow Y of FIG. 1 with the rear portion of the guide rail, arranged for holding a connector.

In FIG. 4 the guide rail 30 is shown in rear view according to the arrow Y of FIG. 1, and there can be seen the longitudinal groove 39, the second latching element 50 consisting of the parts 51, 51' and 52, 52' as well as 56, 56', as well as the securing or holder element 60 composed of the parts 61, 62, 63 and 64.

In FIG. 5 there is shown a front transverse support member 10 in dismantled condition and in perspective cross-sectional view, of a rack or support frame, not shown, for the module supports 20 as well as the front portion of the guide rail 30 with the longitudinal groove 39 and the first latching element 40. The transverse support member 10 has a groove 14 running along its length on the side facing the guide rail 30, in which is inserted a metal strip 11 which is appropriately secured against falling out. The metal strip 11 comprises a plurality of apertures or holes 12 arranged in spaced-apart relationship, which are separated from one another by cross-pieces or webs 13.

In FIG. 6 a rear transverse support member 15 of the rack, not shown, for the module supports 20 is illustrated in dismantled condition and in perspective sectional view as well as the rear portion of the guide rail 30 with the second latching element 50 and the securing or holder element 60. The transverse support member 15 has on its side facing the guide rail 30 a groove 19 running along its length into which is inserted a metal strip 16 appropriately made safe against falling out. The metal strip 16 is provided with a plurality of spaced-apart apertures or holes 17. The holes 17 are separated from one another by means of cross-pieces or webs 18. Further there are shown in FIG. 6 a portion of a printed circuit board 21 and a portion of a connector 22 of the module support 20 which has been inserted in the guide rail 30, as well as a portion of a connector 22' corresponding to and associated with the connector 22.

The assembly of the individual parts takes place substantially as shown in FIG. 5 and FIG. 6 by the chain-dotted lines, where in FIG. 5 one end of the guide rail 30 with the first latching element 40 is brought into positive engagement with the metal strip 11 of the transverse support member 10. In FIG. 6 the other end of the guide rail 30 carrying the second latching element 50 is brought into positive engagement with the metal strip 16 of the transverse support member 15.

In the course of the latter procedure the plug 64 of the securing or holder element 60 engages a recess or opening 23 provided in the connector 22', so that the connector 22' at the same time is firmly pressed with the ledge-like projection 24 against the facing or front surface 25 of the transverse support member 15.

Here it should be pointed out that the two latching elements 40, 50 with the separating or divider elements 45, 55 are substantially the same.

In FIG. 7 there is illustrated by way of example and to a larger scale a first position of the engaged guide rail 30 and there is shown in cross-section the transverse support member 10 and the groove 14 which is here not illustrated in greater detail, but which has a stepped construction, as well as the metal strip 11 disposed in the groove 14 and shown in section with the apertures 12 and cross-pieces or webs 13. Further there are shown in end view the guide rail 30 with the front latching element or member 40 and the separating or separator element 45. In the position shown in FIG. 7 the separating element 45 with the two prongs 46, 46' are disposed in the aperture 12, while the latching heads or snap-in connector tabs 42, 42' of the latching element 40 resiliently bridge two spaced-apart cross-pieces or webs 13 of the metal strip 11, so that the cross-pieces 13 are arranged between the inner side of the latching heads or snap-in connector tabs 42, 42' and the outer side of the separating element 45.

In FIG. 8 there is illustrated, likewise to a larger scale, a second position of the engaged guide rail 30. There is shown in cross-section the transverse support member 10 containing the groove 14, the metal strip 11 disposed in such groove 14 and provided with the apertures 12 and cross-pieces or webs 13, as well as the guide rail 30, depicted in end view, and provided with the front latching element 40 and the separator element 45. In the position shown in FIG. 8 the separating or separator element 45 with the pocket 47 is mounted in staddling fashion upon one of the webs 13, whereas the latching heads or snap-in connector tabs 42, 42' resiliently engage at their outer side between three cross-pieces or webs 13 of the metal strip 11, and which cross-pieces or webs 13 are arranged in spaced relationship with respect to one another and separated from one another by the apertures 12.

The inner distance A forming the pocket 47 or 57 of the separating or separator elements 45 or 55 has to be at least as great as the width A' of the cross-pieces or webs 13 or 18 of the metal strips 11 or 16. Furthermore, the outer width B of the separating elements 45 or 55 must not be greater than the clear or inner width B' of the apertures 12 or 17 in the metal strips 11 or 16.

As will be recognized from FIGS. 3, 4 and 7, it is necessary that the inner distance between the latching arms 41, 41' and 51, 51' of the two latching elements 40, 50 be at least as great as the distance between two cross-pieces or webs 13 separated by one aperture 12.

As seen in FIG. 8, it is further necessary that the inner distance between two adjacent apertures 12 separated by a cross-piece or web 13 be at least as great as the outer distance between the latching arms 41, 41' and 51, 51' of the two latching elements 40, 50.

The guide rail 30 according to the invention with the separating elements 45, 55 makes possible, as against known guide rails, a substantially closer disposition of the module supports 20 in a rack as well as a screwless fastening of the guide rail and of the connector 22' on the transverse support members 10, 15. Of particular advantage is the stability of the guide rails provided by engagement of the separating elements 45, 55 with the transverse support members and thus also on the module supports; tests have shown that the described guide rail 30 provides a shake-proof, militarily usable fastening of the module supports or carriers in the rack.

While there are shown and described present preferred embodiments of the invention, it is to be distinctly understood that the invention is not limited thereto, but may be otherwise variously embodied and practiced within the scope of the following claims. Accordingly,

What we claim is:

1. A guide rail for electronic module supports for latchable attachment to at least one transverse support member of a rack, comprising:
    a guide rail body possessing a substantially U-shaped cross-section and having opposite end regions;
    a first latching element provided at one end region of said substantially U-shaped guide rail body;
    a second latching element provided at the other end region of said substantially U-shaped guide rail body;
    each of said first and second latching elements being provided with a respective pair of resiliently formed latching heads which can engage with spaced-apart apertures separated by cross-pieces;
    a respective separating element disposed between each said latching head of said pair of latching heads of each of the two latching elements;
    each said separating element having a substantially U-configuration opening away from said guide rail body;
    said substantially U-configuration including two spaced legs extending substantially parallel to said resiliently formed latching heads; and
    each said separating element being structurally proportioned to be selectively inserted into the apertures or on to the cross-pieces arranged between the apertures.

2. The guide rail as defined in claim 1, further including:
    at least one transverse support member provided with a metal strip structured to provide said spaced-apart apertures which are separated by said cross-pieces; and
    each respective separating element of said substantially U-configuration having a substantially U-shaped profile cross-section which is open towards said metal strip disposed in the transverse support member.

3. The guide rail as defined in claim 2, wherein:
    the spaced leg of each said substantially U-configuration separating element comprise two spaced-apart resilient prongs which are separated from one another by a pocket.

4. The guide rail as defined in claim 3, wherein:
    said pocket has an internal distance;
    said pocket having at least two internal faces confronting one another;
    said internal distance substantially corresponding to the spacing between said at least two internal faces;
    each of the cross-pieces has a width;
    each of said separating elements has an outer width;
    each of said separating elements having at least two outer faces;
    said outer width substantially corresponding to the distance between said at least two outer faces;
    each of the apertures has a width;
    said internal distance of each pocket as measured between said at least two internal faces thereof and in a direction extending substantially parallel to said metal strip is at least as great as the width of the cross-pieces; and
    said outer width of the separating elements as measured over said at least two outer faces thereof and in a direction extending substantially parallel to said metal strip is at most as great as the width of the apertures.

5. The guide rail as defined in claim 1, wherein:
    each pair of latching heads of said first and second latching elements has a pair of depending arms defining therebetween an inner distance;
    each said pair of depending arms comprising a first depending arm and a second depending arm;
    said first depending arm having a first inner face;
    said second depending arm having a second inner face confronting said first inner face;
    said inner distance defined by said pair of depending arms substantially corresponding to the spacing between said first inner face and said second inner face;
    said inner distance between said depending arms of each of said latching elements and in a direction extending substantially parallel to said metal strip is at least as great as an outer distance of the two spaced-apart cross-pieces separated by an aperture and in a direction extending substantially parallel to said metal strip;
    said two spaced-apart cross-pieces comprising a first cross-piece and a second cross-piece;
    said first cross-piece having at least one outer face remote from said second cross-piece;
    said second cross-piece having at least one outer face remote from said first cross-piece; and
    said outer distance of said two spaced-apart cross-pieces substantially corresponding to the spacing between said at least one outer face of said first cross-piece and said at least one outer face of said second cross-piece.

6. The guide rail as defined in claim 5, wherein:
    an inner distance of two spaced-apart apertures separated by a cross-piece and in a direction extending substantially parallel to said metal strip is at least as great as an outer distance between the depending arms of the two latching elements and in a direction extending substantially parallel to said metal strip;

said two spaced-apart apertures separated by a cross-piece comprising a first aperture and a second aperture;

said first aperture having at least one inner face remote from said separating cross-piece and said second aperture;

said second aperture having at least one inner face remote from said separating cross-piece and said first aperture;

said inner distance of said two spaced-apart apertures substantially corresponding to the spacing between said at least one inner face of said first aperture and said at least one inner face of said second aperture;

said first depending arm having at least one outer face remote from said second depending arm;

said second depending arm having at least one outer face remote from said first depending arm;

said outer distance between said depending arms substantially corresponding to the spacing between said at least one outer face of said first depending arm and said at least one outer face of said second depending arm.

7. The guide rail as defined in claim 1, wherein:
said guide rail body has a rear end;
a securing element having a plug provided at said rear end of the guide rail body.

8. The guide rail as defined in claim 7, wherein:
said first and second latching elements and their separating elements respectively define a first front latching element with a first front separating element and a second rear latching element with a second rear separating element;

the first front latching element with the first front separating element is formed at substantially a right angle downwardly on the guide rail body;

the second rear latching element with the second rear separating element being formed substantially longitudinally on the guide rail body; and the securing element is formed at substantially a right angle upwardly on the guide rail body.

9. The guide rail as defined in claim 1, wherein:
said pair of resiliently formed latching heads define snap-in connector tabs.

10. An electronic module support system, comprising:
at least one transverse support member of a rack;
said at least one transverse support member including at least one row of apertures separated by cross-pieces;
said apertures having substantially equal widths and said cross-pieces having substantially equal thicknesses;
at least one essentially channel-shaped guide rail for electronic modules for latchably engaging said at least one transverse support member;
at least one latching element provided on said at least one guide rail;

said at least one latching element including a pair of resilient latching heads and a separating element arranged therebetween;

said separating element being provided with two spaced-apart resilient prongs separated from one another by a pocket;

said resilient prongs of said separating element being separated from one another by an amount permitting said pocket to engage over one of said cross-pieces;

said separating element having a width permitting it to enter one of said apertures;

said resilient latching heads being separated from one another by an amount permitting them to engage outside of two sequential cross-pieces;

said resilient latching heads having a joint outer dimension permitting them to engage within two outer cross-pieces of three sequential cross-pieces; and said resilient latching heads of said at least one latching element and said resilient prongs of said separating element being dimensionally interrelated such that said pocket engages over said one of said cross-pieces when said resilient latching heads engage within said two outer cross-pieces of three sequential cross-pieces and said separating element enters into said one of said apertures when said resilient latching heads engage outside of said two sequential cross-pieces.

11. The electronic module support system as defined in claim 10, further including:
at least one substantially vertical electrical connector element having a ledge-like projection for bearing against said at least one transverse support member;
a positioning recess provided in said ledge-like projection;
said at least one guide rail having front and rear end regions;
said at least one latching element comprising a first latching element provided at said front end region of said guide rail and a second latching element provided at said rear end region of said guide rail;
said first latching element being formed to extend in a first direction essentially at a right angle to said guide rail;
said second latching element being formed to extend in a second direction essentially parallel to said guide rail;
a securing element having a plug for engaging said positioning recess of said ledge-like projection of said electrical connector element and provided at said rear end region of said guide rail; and
said securing element being formed to extend in a third direction essentially at a right angle to said guide rail.

12. The electronic module support system as defined in claim 11, wherein:
said third direction of extent of said securing element extends substantially opposite to said first direction of extent of said first latching element.

* * * * *